United States Patent
Teng et al.

(10) Patent No.: US 10,103,322 B1
(45) Date of Patent: Oct. 16, 2018

(54) METHOD TO REMOVE SIDEWALL DAMAGE AFTER MTJ ETCHING

(71) Applicant: Headway Technologies, Inc., Milpitas, CA (US)

(72) Inventors: Zhongjian Teng, Santa Clara, CA (US); Tom Zhong, Saratoga, CA (US); Jesmin Haq, Milipitas, CA (US)

(73) Assignee: Headway Technologies Inc., Milpitas, CA (US)

( * ) Notice: Subject to any disclaimer, the term of this patent is extended or adjusted under 35 U.S.C. 154(b) by 0 days.

(21) Appl. No.: 15/465,642

(22) Filed: Mar. 22, 2017

(51) Int. Cl.
| H01L 43/12 | (2006.01) |
| H01L 21/02 | (2006.01) |
| G11B 5/39  | (2006.01) |
| H01L 43/02 | (2006.01) |
| H01L 43/08 | (2006.01) |

(52) U.S. Cl.
CPC ............ *H01L 43/12* (2013.01); *G11B 5/3909* (2013.01); *H01L 21/02071* (2013.01); *H01L 21/02096* (2013.01); *H01L 43/02* (2013.01); *H01L 43/08* (2013.01)

(58) Field of Classification Search
CPC ......... H01L 43/12; H01L 43/02; H01L 43/08; H01L 21/02096; H01L 21/02071; G11B 5/3909

See application file for complete search history.

(56) References Cited

U.S. PATENT DOCUMENTS

| 6,759,263 B2 | 7/2004 | Ying et al. |
| 7,993,535 B2 | 8/2011 | Jiang et al. |
| 8,105,948 B2 | 1/2012 | Zhong et al. |
| 8,722,543 B2* | 5/2014 | Belen ...................... H01L 43/12 257/295 |
| 8,822,994 B2 | 9/2014 | Zhang et al. |
| 9,166,154 B2 | 10/2015 | Satoh et al. |
| 9,812,155 B1* | 11/2017 | Roy ...................... G11B 5/1272 |
| 2006/0132983 A1 | 6/2006 | Osugi et al. |
| 2016/0013397 A1* | 1/2016 | Kitagawa ................ H01L 43/08 257/421 |
| 2016/0020386 A1 | 1/2016 | Kim et al. |
| 2017/0025603 A1 | 1/2017 | Hara |
| 2017/0033282 A1* | 2/2017 | Wang ...................... H01L 43/12 |

OTHER PUBLICATIONS

PCT Search Report, International Application No. PCT/US2018/020854, Applicant: Headway Technologies, Inc., dated Jun. 18, 2018, 12 pages.

* cited by examiner

*Primary Examiner* — Michael Trinh
(74) *Attorney, Agent, or Firm* — Saile Ackerman LLC; Stephen B. Ackerman

(57) ABSTRACT

A method for etching a magnetic tunneling junction (MTJ) structure is described. A stack of MTJ layers on a bottom electrode on a wafer is provided. A hard mask layer is provided on the MTJ stack. The hard mask layer is patterned to form a hard mask. The MTJ stack is patterned to form a MTJ device wherein sidewall damage is formed on sidewalls of the MTJ device. The sidewall damage is removed by applying a CMP slurry which physically attacks and removes the sidewall damage on the MTJ device.

20 Claims, 2 Drawing Sheets

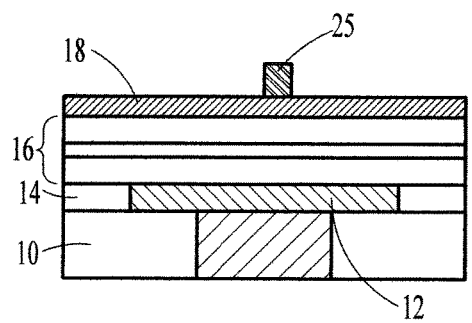
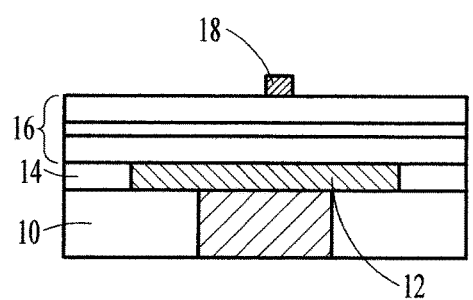
Figure 1
Figure 2
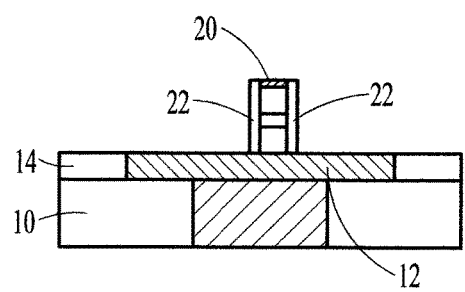
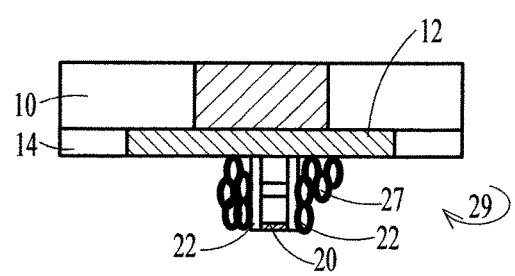
Figure 3
Figure 4

METHOD TO REMOVE SIDEWALL DAMAGE AFTER MTJ ETCHING

TECHNICAL FIELD

This application relates to the general field of magnetic tunneling junctions (MTJ) and, more particularly, to etching methods for forming MTJ structures.

BACKGROUND

For spin torque applications, the dry etching process of the magnetic tunnel junction (MTJ) is the critical step determining MTJ performance. The key issue is the sidewall damage caused by the MTJ etching process. A typical MTJ etched by a RIE (reactive ion etching) process is found to have sidewall damage, possibly caused by oxygen or other chemicals during the etching process and/or by exposure to oxygen after the etching process. The sidewall damage will lead to a size dependence of magnetic resistance ratio (DRR) which will reduce the read margin for the MRAM (magneto-resistive random-access memory) chip functionality. This damage will be getting worse as MRAM technology decreases in size to 65 nm technology and beyond.

This sidewall damaged layer around the MTJ is believed to be a chemically unstable layer. The thermal treatment of the semiconductor back end of line (BEOL) process will enhance the sidewall damage due to atom diffusion and will result in quickly degraded MTJ performance.

Several patents teach methods to remove sidewall damage. These include US Patent Applications 2017/0025603 (Hara), 2016/0020386 (Kim et al), and 2006/0132983 (Osugi et al). Other patents teach uses of chemical mechanical polishing (CMP), including U.S. Pat. No. 8,105,948 (Zhong et al) and U.S. Pat. No. 8,822,994 (Zhang et al). All of these references are different from the present disclosure.

SUMMARY

It is an object of the present disclosure to provide an improved method of forming MTJ structures.

Yet another object of the present disclosure is to provide a method of removing sidewall damage after etching in the fabrication of MTJ devices.

A further object is to provide a method of removing sidewall damage by molecular action after etching in the fabrication of MTJ devices.

Yet another object is to provide a method of removing sidewall damage by molecular action of a chemical mechanical polishing (CMP) slurry after etching in the fabrication of MTJ devices.

In accordance with the objectives of the present disclosure, a method for etching a magnetic tunneling junction (MTJ) structure is achieved. A stack of MTJ layers is provided on a bottom electrode on a wafer. A hard mask layer is provided on the MTJ stack. The hard mask layer is patterned to form a hard mask. The MTJ stack is patterned to form a MTJ device wherein sidewall damage is formed on sidewalls of the MTJ device. The sidewall damage is removed by applying a physical treatment to the sidewall of the MTJ device.

Also in accordance with the objectives of the present disclosure, a method for etching a magnetic tunneling junction (MTJ) structure is achieved. A stack of MTJ layers is provided on a bottom electrode on a wafer. A hard mask layer is provided on the MTJ stack. The hard mask layer is patterned to form a hard mask. The MTJ stack is patterned to form a MTJ device wherein sidewall damage is formed on sidewalls of the MTJ device. The sidewall damage is removed by applying a slurry which physically attacks and removes the sidewall damage on the MTJ device.

Also in accordance with the objectives of the present disclosure, a method for etching a magnetic tunneling junction (MTJ) structure is achieved. A stack of MTJ layers on a bottom electrode on a wafer. A hard mask layer is provided on the MTJ stack. The hard mask layer is patterned to form a hard mask. The MTJ stack is patterned to form a MTJ device wherein sidewall damage is formed on sidewalls of the MTJ device. The sidewall damage is removed by applying a slurry which physically attacks and removes the sidewall damage on the MTJ device using one or both of a CMP process and a megasonic or ultrasonic process.

BRIEF DESCRIPTION OF THE DRAWINGS

In the accompanying drawings forming a material part of this description, there is shown:

FIGS. 1 through 6 illustrate in cross-sectional representation steps in a preferred embodiment of the present disclosure.

DETAILED DESCRIPTION

Figure 5:
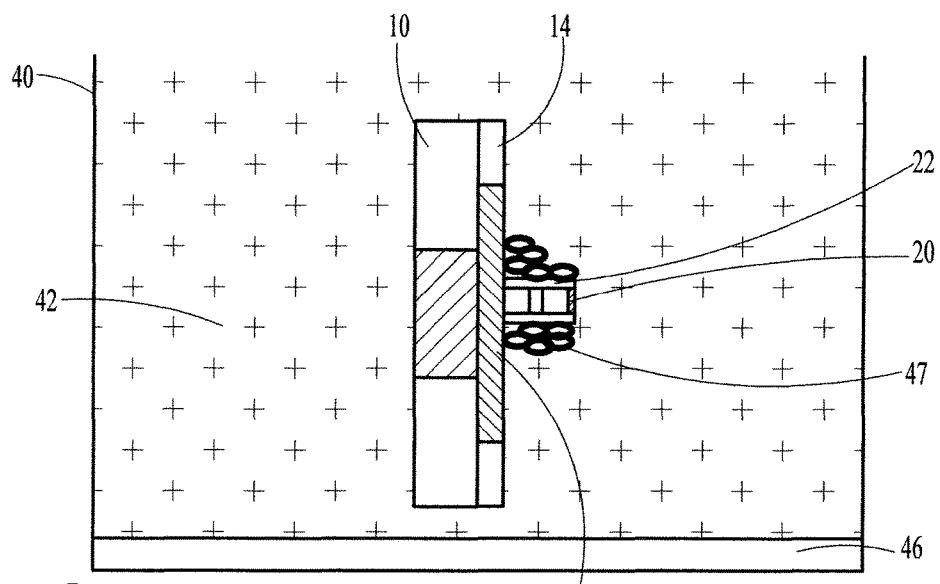

The basic idea of the present disclosure is to use molecular movement to attack the sidewall damage layer caused by MTJ etching. The molecular movement is created by a CMP polisher with particular slurries.

Referring now to FIGS. 1 through 6, the novel disclosure will be described in detail. The process begins with a traditional MTJ etching process. Referring now more particularly to FIG. 1, there is shown a bottom electrode 12 formed on the substrate 10 and insulation layer 14. Now, layers 16 are deposited on the bottom electrode to form a magnetic tunnel junction. Layers 16 include one or more pinned layers, tunnel barrier layers, and free layers, as is conventional in the art. Finally a hard mask layer 18 is deposited on the MTJ layers 16.

A photoresist mask 25 is formed over the hard mask layer. As shown in FIG. 2, the hard mask layer is patterned using the photoresist mask 25 to form a hard mask 18. The MTJ etching preferably is performed with a RIE process, which includes hard mask etching, as shown in FIG. 2, followed by RIE etching of the MTJ layers 16, as shown in FIG. 3.

After the MTJ etching process, the wafer will be unloaded from the etcher tool and exposed to the atmosphere. The MTJ sidewall can be damaged 22 either during the etching process or by exposure to the atmosphere causing sidewall oxidation, illustrated in FIG. 3. The damaged layer 22 will lead to lower MR ratio and worse magnetic properties (lower coercivity (Hc), lower energy barrier (Eb), higher critical writing current (Ic), higher critical writing voltage (Vc)) and also will induce non-uniformity of electric and magnetic performance. This kind of sidewall damage will worsen especially as the MTJ size decreases.

Referring now to FIG. 4, we introduce a new scheme for protecting the MTJ by removing the sidewall damaged layer 22. The sidewall damage caused by the MTJ etching process and by exposing the MTJ sidewall to the atmosphere can be removed by applying a physical treatment, which uses a chemical mechanical polishing (CMP) slurry 27 to attack the sidewall materials. The wafer is held in the head of a CMP tool (not shown). The head and platen rotate 29 during the CMP process. The slurry particles contact and attack the sidewall materials 22. The physical treatment process will remove the sidewall damaged layer 22 to a depth of between about 5 to 150 A SiOx equivalent, and preferably 50 A SiOx equivalent.

For achieving a good treatment performance, the polishing slurry pH value should be between about 5 to 10 and the slurry particle size should be between about 1 A to 1000 A, and preferably 30 A~100 A. The wafer seating in the CMP tool should be without pressure and without vacuum during the polishing time. Normally, CMP is under pressure or vacuum, but for our purposes of removing sidewall damage, no pressure or vacuum should be applied.

Other physical treatments including megasonic or ultrasonic methods with slurries can also remove sidewall damage. Megasonic or ultrasonic methods work by generating controlled acoustic cavitation in the cleaning fluid. Acoustic cavitation is produced by the pressure variations in sound waves moving through a liquid. We use a CMP slurry having a pH value of between 0 and 14 and particle size of up to 10 ų m (100,000 Angstroms) as the fluid. The slurry particles will attack the sidewall with the megasonic or ultrasonic enhancement. Those methods can be applied after the CMP process described above or in place of the CMP process. In those methods, as shown in FIG. 5, slurry 42 will be put into a tank 40 which includes Megasonic or Ultrasonic generators 46. The wafer 10 will be immersed into the tank for processing. The wafer will be held in a polishing head, not shown, and rotated during processing. The slurry particles 47 contact and attack the sidewall materials 22.

Figure 6:
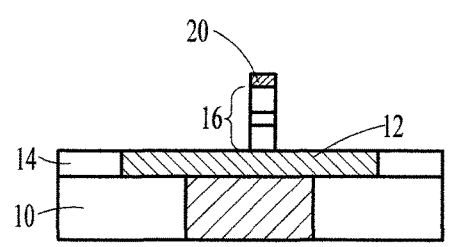

FIG. 6 illustrates the wafer after physical treatment by the CMP process described with respect to FIG. 4, optionally followed by or replaced by the megasonic or ultrasonic process described with respect to FIG. 5. The sidewall damaged layer 22 has been removed from the MTJ stack 16.

The size dependence of DRR % is always observed if the MTJ etching process is performed without the sidewall damage removal of the present disclosure. The DRR % will drop as the MTJ size decreases. To maintain the DRR % for small MTJ size will be the main issue for STT-MRAM products. Using the process of the present disclosure, the DRR % could be maintained without MTJ size dependence due to the removal of the sidewall damaged layer. Advantageously, spin torque efficiency could be enhanced and lower Vc and Ic could be achieved as well.

The physical sidewall damage removal of the present disclosure could be used for MTJ devices with in-plane/out-of plane or/partial out-of-plane anisotropy for embedded memory applications in, e.g., embedded high-density PMA Spin-Torque-Transfer (STT) MRAM.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for etching a magnetic tunneling junction (MTJ) structure comprising:
   providing a stack of MTJ layers on a bottom electrode on a wafer;
   patterning said MTJ stack to form a MTJ device wherein sidewall damage is formed on sidewalls of said MTJ device; and
   thereafter removing said sidewall damage by applying a physical treatment comprising applying a slurry which physically attacks and removes said sidewall damage on said MTJ device.

2. The method according to claim 1 further comprising:
   providing a hard mask layer on said MTJ stack;
   patterning said hard mask layer to form a hard mask; and
   using said hard mask in said patterning of said MTJ stack.

3. The method according to claim 1 wherein said MTJ stack is patterned using a physical etching process wherein said sidewall damage is formed by said physical etching process.

4. The method according to claim 3 wherein said sidewall damage is formed after said physical etching process when said MTJ device is exposed to atmosphere.

5. The method according to claim 1 wherein said physical treatment comprises:
   holding said wafer in a chemical mechanical polishing (CMP) tool; and
   applying said slurry to said wafer while rotating said CMP tool wherein said slurry physically attacks and removes said sidewall damage.

6. The method according to claim 1 wherein said physical treatment removes said sidewall damage layer to a depth of between about 5 and 150 Angstroms.

7. The method according to claim 1 wherein said slurry has a pH of between about 5 and 10 and a particle size of between about 1 and 1000 Angstroms, and preferably between about 30 and 100 Angstroms.

8. The method according to claim 5 wherein said holding said wafer in said CMP tool is without pressure and without vacuum.

9. The method according to claim 1 wherein said applying a slurry to said wafer comprises one or both of:
   applying a first slurry having a pH of between about 5 and 10 and a particle size of between about 1 and 1000 Angstroms, and preferably between about 30 and 100 Angstroms in a CMP process without pressure and without vacuum; and
   immersing said wafer in a second slurry in a tank having megasonic or ultrasonic generators wherein said second slurry has a pH between 0 and 14 and a particle size of up to 100,000 Angstroms.

10. A method for etching a magnetic tunneling junction (MTJ) structure comprising:
    providing a stack of MTJ layers on a bottom electrode on a wafer;
    providing a hard mask layer on said MTJ stack;
    patterning said hard mask layer to form a hard mask;
    patterning said MTJ stack to form a MTJ device wherein sidewall damage is formed on sidewalls of said MTJ device; and
    thereafter removing said sidewall damage by applying a slurry which physically attacks and removes said sidewall damage on said MTJ device.

11. The method according to claim 10 wherein said MTJ stack is patterned using a physical etching process.

12. The method according to claim 11 wherein said sidewall damage is formed by said physical etching process.

13. The method according to claim 11 wherein said sidewall damage is formed after said physical etching process when said MTJ device is exposed to atmosphere.

14. The method according to claim 10 wherein said applying said slurry comprises:
    holding said wafer in a chemical mechanical polishing (CMP) tool; and
    applying said slurry to said wafer while rotating said CMP tool.

15. The method according to claim 10 wherein said applying said slurry removes said sidewall damage layer to a depth of between about 5 and 150 Angstroms.

16. The method according to claim 14 wherein said applying said slurry to said wafer comprises one or both of:
  applying a first slurry having a pH of between about 5 and 10 and a particle size of between about 1 and 1000 Angstroms, and preferably between about 30 and 100 Angstroms in a CMP process without pressure and without vacuum; and
  immersing said wafer in a second slurry in a tank having megasonic or ultrasonic generators wherein said second slurry has a pH between 0 and 14 and a particle size of up to 100,000 Angstroms.

17. The method according to claim 14 wherein said holding said wafer in said CMP tool is without pressure and without vacuum.

18. A method for etching a magnetic tunneling junction (MTJ) structure comprising:
  providing a stack of MTJ layers on a bottom electrode on a wafer;
  providing a hard mask layer on said MTJ stack;
  patterning said hard mask layer to form a hard mask;
  patterning said MTJ stack to form a MTJ device wherein sidewall damage is formed on sidewalls of said MTJ device; and
  thereafter removing said sidewall damage by applying a slurry which physically attacks and removes said sidewall damage on said MTJ device using one or both of a CMP process and a megasonic or ultrasonic process.

19. The method according to claim 10 wherein said applying said slurry comprises:
  holding said wafer in a polishing tool; and
  applying said slurry to said wafer while rotating said polishing tool.

20. The method according to claim 18 wherein
  said CMP process comprises applying a first slurry having a pH of between about 5 and 10 and a particle size of between about 1 and 1000 Angstroms, and preferably between about 30 and 100 Angstroms; and
  said megasonic or ultrasonic process comprises immersing said wafer in a second slurry in a tank having megasonic or ultrasonic generators wherein said second slurry has a pH between 0 and 14 and a particle size of up to 100,000 Angstroms.

* * * * *

UNITED STATES PATENT AND TRADEMARK OFFICE
CERTIFICATE OF CORRECTION

PATENT NO. : 10,103,322 B1
APPLICATION NO. : 15/465642
DATED : October 16, 2018
INVENTOR(S) : Zhongjian Teng et al.

Page 1 of 1

It is certified that error appears in the above-identified patent and that said Letters Patent is hereby corrected as shown below:

On the Title Page

In the Inventors (72), delete third Inventor "Jesmin Haq, Milipitas, CA (US)" and replace with
-- Jesmin Haq, Milpitas, CA (US) --.

Signed and Sealed this
Twenty-ninth Day of January, 2019

Andrei Iancu
*Director of the United States Patent and Trademark Office*